United States Patent [19]

Huang

[11] Patent Number: 4,937,648
[45] Date of Patent: Jun. 26, 1990

[54] RESISTANT TRANSISTOR

[76] Inventor: Jack S. T. Huang, 10835 40th Ave. North, Plymouth, Minn. 55441

[21] Appl. No.: 445,137

[22] Filed: Nov. 30, 1989

Related U.S. Application Data

[63] Continuation of Ser. No. 838,844, Mar. 12, 1986, abandoned.

[51] Int. Cl.⁵ ............................................. H01L 27/04
[52] U.S. Cl. ................................... 357/50; 357/20; 357/48; 357/49; 357/89
[58] Field of Search ..................... 357/20, 48, 49, 50, 357/89

[56] References Cited

U.S. PATENT DOCUMENTS

| | | |
|---|---|---|
| 4,014,718 | 3/1977 | Tomozawa et al. . |
| 4,109,274 | 8/1978 | Belenkov et al. . |
| 4,247,862 | 1/1981 | Klein ........................... 357/49 |
| 4,252,579 | 2/1981 | Ho et al. . |
| 4,266,238 | 5/1981 | Nishizawa . |
| 4,282,648 | 8/1981 | Yu et al. . |
| 4,424,526 | 1/1984 | Dennard et al. . |
| 4,450,466 | 5/1984 | Nishizawa et al. ............ 357/49 |
| 4,519,128 | 5/1985 | Chesebro et al. ............. 357/49 |

Primary Examiner—Edward J. Wojciechowicz
Attorney, Agent, or Firm—Theodore F. Neils; William T. Udseth; John G. Shudy, Jr.

[57] ABSTRACT

A bipolar transistor having higher conductivity semiconductor material in the substrate as compared to the active base region to provide charge generation disturbance protection.

13 Claims, 2 Drawing Sheets

RESISTANT TRANSISTOR

This application is a continuation-in-part, continuation, division, of application Ser. No. 06/838,844, filed Mar. 12, 1986 now abandoned.

BACKGROUND OF THE INVENTION

The present invention relates to bipolar transistors, and more particularly, to bipolar transistors formed in monolithic integrated circuit chips which are subject to charge generating disturbances.

Monolithic integrated circuit structural features have been shrinking rapidly in size in recent years. Along with this shrinkage, electrical currents and electrical charge accumulations formed and manipulated in integrated circuits based on these features have also been diminishing in value. As a result, charge accumulation quantities generated by certain charge generating disturbances which, in integrated circuits with larger feature sizes, would not be a problem are now quantities which are sufficiently large to cause difficulties in smaller feature integrated circuits.

In voltage level state switching circuits, such as logic circuits or memory circuits, which are constructed using such smaller integrated circuit structures, these disturbance charges can be sufficient to cause switching from an existing logic state to another at point in the circuit where such charge is generated. For instance, in an npn bipolar transistor, holes collected in the base from the emitter-base and the collector-base semiconductor pn junction regions as a result of such a disturbance could accumulate sufficiently to forward bias the emitter-base junction giving rise to sufficient additional base current to switch such a transistor, otherwise in the "off" condition, into the "on" condition. Also, electrons from such a disturbance collected from such a disturbance in the collector from the collector-base and the collector-substrate semiconductor pn junction regions could be sufficient in number to reduce the voltage at the collector so far as to again cause such a transistor to appear to switch from the "off" condition to the "on" condition.

Typically, such disturbances are local to the region near where the disturbance is generated and are temporary; thus, such a disturbance is often termed a "single event upset". Also, though the disturbance cause may be temporary, the results of the disturbance may be stored and are subject to being propagated further in the system which may lead to longer term and more significant effects.

A typical source of such charge generating disturbances is particle radiation. Such particles impinging on a monolithic integrated circuit will have "interactions" with the semiconductor material lattice structure and electrons along its path through the integrated circuit semiconductor material. This will result in raising the energy of the electrons involved into the conduction band and leaving corresponding holes in the valance band.

Should such electron-hole pairs be generated sufficiently close to a semiconductor pn junction, the electrons and holes so situated are subject to being collected by the action of electric fields in the region resulting because of voltage supplied to such junction and because of diffusion toward such junction. The structure of transistor devices and monolithic integrated circuits, and the method of operating both such devices and the circuits using them generally is such that only reverse-biased pn semiconductor junctions need to be considered. The collection of holes in the base and the collection of electrons in the collector that could lead to npn bipolar transistor voltage state changes, as indicated above, could be the result of such an impingement.

A further phenomena accompanying such radiation particle impingement across regions separated by a reverse-biased semiconductor pn junction is the "funneling" effect. This term is used to describe the process which such an impinging particle serves to, in effect, bend the depletion region boundary to allow the depletion region to follow the path of the particle. Thereby, the depletion region is extended in an elongated fashion along such a path to form a "funnel" in the semiconductor material. Such a "funnel" across the semiconductor pn junctions in a bipolar transistor could result in collector-to-emitter "punch through" leading to a short circuit between the collector and emitter of such transistor.

In a typical npn bipolar transistor, there is a substantially doped active base region provided directly between the emitter region and the collector region of the transistor. Further, there is a more highly doped inactive base region extending laterally from the active base region and continuing to the major surface of the integrated circuit semiconductor material to permit electrical contact to be made to the base region. Because the volume of the active base region is usually quite small, there is a relatively low number of electron-hole pairs generated by an impinging radiation particle in such region. Further, if one does so impinge, the lifetime of the generated electrons and holes will be small since recombination will occur rapidly in the highly doped inactive and active base regions such that relatively little current flow will result in the base region.

Such high doping also keeps the length of any "funnel" extending into the base region quite short, again because of rapid recombination. Further, the base region of a bipolar transistor is usually operated in such a manner that there is a relatively low circuit impedance in the external circuit between the base and emitter regions. This means that any currents that do form through the base region, because of charge generated in that region, are relatively unlikely to cause a significant voltage drop between the base region and the emitter region.

These circumstances lead to two of the above charge generation disturbance effects in bipolar transistors usually being relatively unimportant, that is, that the holes collected in the base region might switch a bipolar transistor from the "off" to the "on" condition, and that the possibility of a "funnel" occurring through the active base region might lead to a short circuit between the transistor emitter and collector regions.

The consequence of these effects being relatively unimportant is that the remaining effect, the collection of electrons in the collector region from the collector-base and the collector-substrate semiconductor pn junctions, is the dominant effect resulting from a radiation particle impingement in an npn bipolar transistor. This effect, which could lead to reducing the value of voltage occurring at the collector region sufficiently such that the collector would go from a high voltage state in a logic circuit to a low voltage state, is dominant because (i) the relatively large collector-substrate area, and because (ii) such npn transistors are usually constructed on a lightly doped p-type conductivity substrate.

Thus, a desirable npn bipolar transistor would have a construction which would minimize the accumulation of electrons in the transistor collector regions as a result of an impinging radiation particle, and the effects of any such accumulation. A further desire for such a construction is that it be compatible with structures useful in shrinking the size of such a transistor to thereby increase component density in monolithic integrated circuit chips using these transistors.

SUMMARY OF THE INVENTION

The present invention provides a bipolar transistor construction having higher conductivity semiconductor material barrier on the opposite side of the transistor collector region from the base and emitter regions into which barrier extends a device electrical isolation structure. Such higher conductivity semiconductor material may be (i) a layer followed by lower conductivity material of the same conductivity type, (ii) a layer following a layer of lower conductivity material of the same conductivity type, or (iii) it may encompass the remainder of the semiconductor material in that direction.

DESCRIPTION OF THE PREFERRED EMBODIMENT

Figure 1:
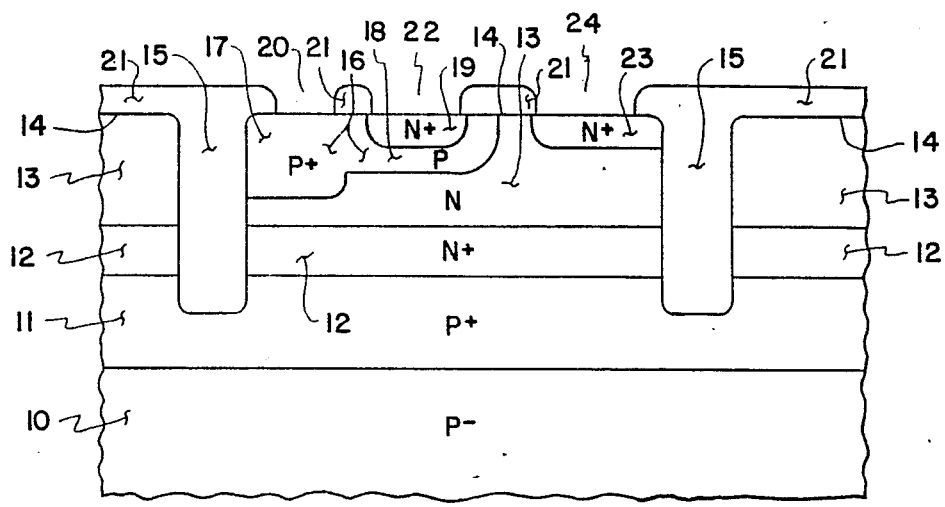
FIG. 1 shows a structural sketch of first embodiment of the invention.

FIG. 1 shows a structural sketch, not necessarily in proportion or to scale, of a portion of a monolithic integrated circuit in which a bipolar transistor structure has been provided. Shown are remaining portions of a silicon substrate, 10, with which construction of the device was begun. Substrate 10 has the surface thereof at which transistor construction occurs located in the (100) crystal plane, and is doped with boron atoms in a concentration of about $10^{15}$ atoms/cm$^3$, designated as a p$^-$ concentration, which leads to a resistivity on the order of 9 to 11 $\Omega$-cm. This is a relatively high resistivity, or equivalently, a low conductivity.

In the usual monolithic integrated circuit vertical bipolar transistor construction, a buried layer region would be next provided in or on this substrate after which would be provided the rest of the collector region, a base region and an emitter. However, such a structure leads to large numbers of electrons being collected in the collector region from the collector-base and collector-substrate semiconductor pn junctions of such a transistor after a charge disturbance such as a radiation particle impingement, as indicated above. Further, a substantial funnelling effect can occur leading from this buried layer region into such a lightly doped substrate resulting in additional depletion layer volume for generating electron-hole pairs.

Consider conditions of reverse biased junctions in such a bipolar transistor which means for such a transistor that it is in the "off" condition, so only an extremely small current can flow between the collector and emitter thereof.

This results in the collector region being in a high voltage state since very little current flows through the load device connecting the collector region to the supply of relatively positive voltage. The substrate and the emitter region will be connected to supplies, or a supply, of relatively negative voltage. The effect of a radiation particle impingement on this transistor can be determined by considering only effect at the collector-substrate junction. The effects at this junction will be the only important one because of the relatively larger area of this junction compared to others in the transistor, and because of the lightly doped characteristic of the substrate.

The holes generated by such a radiation particle will collect in the substrate and will be dissipated to the voltage supply to which the substrate is connected, usually ground. The electrons, on the other hand, in collecting in the collector region including the buried layer of such a transistor, accumulate there without being dissipated in the external circuit because the load device of substantial impedance connected to the collector region will not permit significant current to flow therethrough. Thus, these accumulating electrons lead to a decreasing voltage potential at the collector region which, if sufficiently large, will approach the low voltage state in the logic circuit arrangement containing this transistor. Such a voltage drop could erroneously switch the succeeding circuitry connected to the transistor collector region.

The magnitude of the voltage shift resulting from the radiation particle impingement will depend on the number of electrons collected in the collector region and the capacitance occurring between the substrate and the collector region. The chances of such an erroneous switching increase as the device shrinks in size for purposes of increasing circuit component density because the amount of charge needed to cause such switching becomes smaller faster because of decreasing junction capacitance than the decrease in the probability of such a particle impinging on the collector and substrate (leading to such charge collection) because of decreasing area.

The structure of FIG. 1 has an additional barrier layer, 11, introduced to counter such effect in a manner indicated below. Barrier layer 11, which can be put on top of substrate 10 by epitaxial deposition or can be formed in the upper reaches of substrate 10 by implantation followed by diffusion, is of silicon having boron as a dopant distributed therein in a concentration of approximately $10^{18}$ atoms/cm$^3$ giving a concentration designated p$^+$. Barrier layer 11 is approximately 2 $\mu$m thick.

A buried layer, 12, is provided on barrier layer 11 to reduce the resistance of the device collector. This buried layer is formed by implantation of, followed by diffusion of, arsenic atoms to a portion of what otherwise would have been more of barrier layer 11. The arsenic atoms are provided in a concentration of around $10^{19}$ atoms/cm$^3$ to provide a concentration designated n$^+$. Buried layer 12 has a thickness in the vicinity of 1.4 $\mu$m.

A further layer, 13, to provide the remaining portions of the collector region, and to contain the base and emitter regions for the bipolar transistor, is formed on buried layer 12. The upper surface, 14, of layer 13 in FIG. 1 is the major surface for the semiconductor material body and at which contacts are made to the emitter, base and collector regions to control operation of the bipolar transistor. Layer 13 is provided by epitaxial deposition to a thickness of about 0.8 $\mu$m having arsenic atoms distributed therein in a concentration of $2 \times 10^{16}$ atoms/cm$^3$ to give a concentration designated n.

An electrically isolated portion of some of the semiconductor material body so formed is provided by an isolating structure, 15. Isolating structure 15, if viewed on a plane containing surface 14, would show a completely closed path in that plane, typically a rectangular strip, as isolating structure 15 forms a rectangular cylindrical structure in extending from surface 14 into the semiconductor material body. This closed wall structure surrounds the enclosed portions of layers 12 and 13 entirely, and surrounds an enclosed portion of layer 11 also but not all of layer 11. This is because structure 15 extends from surface 14 only part way into layer 11 rather than all the way through.

Isolating structure 15 is an electrical insulator at least in part to thereby prevent conduction of electrical current therethrough. A typical construction of isolating structure 15 would be to have a silicon dioxide outer portion grown on the surfaces of the various semiconductor layers exposed after a trench to accommodate structure 15 has been etched therein. Undoped polysilicon is deposited to fill the interior portions of structure 15 lined with such silicon dioxide.

The portion of layer 13 within the isolated region contains a transistor base region, 16, comprising an inactive base region, 17, and an active base region, 18. Finally, an emitter region, 19, is shown contained within base region 16. Active base region 17 is the portion of base region 16 located primarily and directly between emitter region 19 and the portions of layer 13 in the isolated region below the emitter region. Inactive base region 17 is continuous with and adjacent to the left side of active base region 18 and extends to surface 14 above which an opening, 20, in a silicon dioxide surface insulating layer, 21. Parts of layer 21 are continuous with and joined in isolating structure 15.

Opening 20 is provided to receive a device interconnection contact to base region 16. A further opening, 22, in the surface insulating layer 21 to surface 14 is to provide a further device interconnection system contact to emitter 19. A final region, 23, is provided within the portion of layer 13 in the isolated region to provide an electrical contact region for the transistor collector. Such an interconnection system contact is made to region 23 through a further opening, 24, in surface insulating layer 21. Neither of the interconnection system contacts to emitter 19 nor to collector contact region 23 are shown in FIG. 1.

Base region 16 is formed of boron atoms implanted into, and diffused within, layer 13. The concentration in inactive base region 17 is approximately $10^{19}$ atoms/cm$^3$ giving a concentration designated p$^+$. The boron atoms are distributed in active base region 18 in a concentration of $10^{17}$ atoms/cm$^3$ to give a concentration designated p. Note that this will lead to a conductivity in the active base region that is lower than that of barrier layer 11. The bottom of active base region 18 in FIG. 1 is approximately 0.5 $\mu$m below surface 14.

Emitter region 19 is formed by arsenic atoms implanted into, and diffused within, base region 16 in a concentration of $10^{20}$ atoms/cm$^3$ with the bottom of that region seperated from surface 14 by approximately 0.35 $\mu$m. The separation between the bottom of emitter region 19 and the bottom of active base region 18 gives a base width for the transistor of approximately 0.15 $\mu$m. Collector contact region 23 is formed simultaneously with emitter region 19 and therefore has approximately the same depth and concentration of arsenic atoms.

This structure of FIG. 1 provides an increased capacitance across the collector-substrate semiconductor pn junction because of the increased conductivity of barrier layer 11 compared to what it would be with just substrate 10 being adjacent to buried layer 12. The increase in capacitance means that for any given number of electrons collected in the collector region there will result a smaller voltage drop than there would be in the lower capacitance situation. Thus, the change in voltage at the collector is less likely to be large enough to result in a drop below the high voltage level state for the logic system containing the transistor that is sufficient to change the state of a logic gate connected to the collector. There is a slight penalty for an increased capacitance at this junction in that such capacitance will lead to a slight slowing of rise and fall times of transitions between high and low voltage value states.

A further advantage in barrier layer 11 is the sharp restriction on funnel lengths in the funnels resulting from the funnelling effect occurring because of an impinging radiation particle crossing the collector-substrate junction. Because of the increased conductivity of barrier layer 11 leading to substantially higher electron-hole recombination rates, the depletion layer extension in a funnel will not extend nearly as far into barrier layer 11 as it would into substrate 10 if substrate 10 were adjacent to buried layer 12. Thus, there will be fewer electrons swept across the depletion layer into buried layer 12.

Further, many of the electrons generated in barrier layer 11 by an impinging radiation particle will, rather than diffusing toward a funnel extension of the depletion layer, now be swept toward substrate 10. This occurs because of the potential barrier that barrier layer 11 represents with respect to substrate 10 due to the higher carrier concentration in barrier layer 11. Even if the funnelling effect leads to a funnel extending through barrier layer 11 into substrate 10, electrons generated in substrate 10 will be "reflected" back into substrate 10 because of this potential barrier represented by barrier layer 11. Therefore, again barrier layer 11 leads to fewer electrons being swept into buried layer 12 to reduce the voltage at the collector of the bipolar transistor.

Finally, because isolating structure 15 is arranged to extend into the semiconductor body from surface 14 into barrier layer 11, barrier layer 11 also serves to prevent any inversion in conductivity type of semiconductor material around the ends of isolating structure 15. Such an inversion path, which can much more easily occur in lightly doped semiconductor material like substrate 10, can provide a low resistance path from the portion of buried layer 12 included in the isolated region within isolating structure 15 to portions of buried layer 12 outside of isolating structure 15. Also, the parasitic npn transistor which could be formed by the buried layer 12 portions within and without the isolated region along with the p-type conductivity material below structure 15 located therebetween will be made quite inefficient by the use of highly doped p-type conductivity material. The presence of substrate 10 at the end of structure 15 and adjacent to buried layer 12 would require the inclusion of heavily doped regions under the ends of isolating structure 15 within substrate 10 to prevent such inversions and such parasitic npn transistors.

Barrier layer 11 should be greater in thickness than the width of the depletion layer expected to occur about the collector-substrate pn junction when the collector region is reverse biased with respect to layers 10 and 11 by the ordinary transistor operating voltage. Such voltage is, in typical transistor operation, provided through a load device connected to collector contact region 23 by the electrical interconnection arrangement, all not shown in FIG. 1. If this depletion layer is allowed to reach substrate 10, the advantages of layer 11 will be lost. If a buried layer 12 is not provided to reduce collector resistance so that instead layer 13 is adjacent to barrier layer 11, barrier layer 11 can be somewhat thinner since more of the depletion region will extend into less highly doped layer 13.

Figure 2:
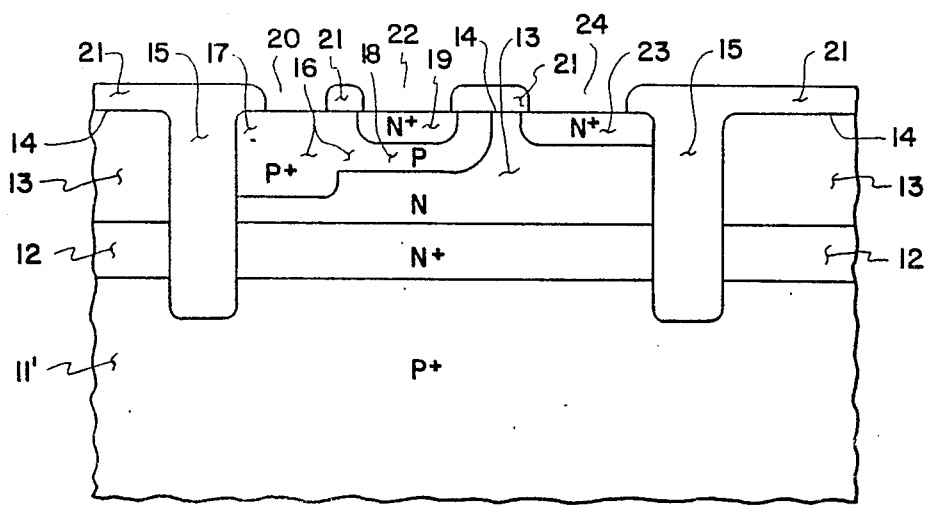
FIG. 2 shows a structural sketch of an alternative embodiment of the present invention.

Another possibility is shown in FIG. 2 in which barrier layer 11 is in effect extended through the remainder of the semiconductor body so that it now encompasses and becomes the substrate. All of the structures in FIG. 2 which serve approximately the same purpose as those in FIG. 1 carry similar designations in FIG. 2 as they had in FIG. 1. Here, the substrate is now designated 11' rather than either 10 or 11 as it was in FIG. 1. Again, buried layer 12 may not be provided to reduce collector resistance so that layer 13 would then be adjacent to substrate 11'.

The structure of FIG. 2 retains the advantages of increased collector-substrate capacitance, reduced funnelling lengths in substrate 11', and elimination of semiconductor material conductivity inversions and of parasitic npn transistors about the ends of isolating structure 15. This is because of the high concentration of boron atoms maintained throughout substrate 11' leading to a high conductivity in substrate 11'. The dopant concentration in, and so the conductivity of, substrate 11' is above that of active base region 18.

On the other hand, the "reflecting" advantage of the more heavily doped barrier layer 11 versus more lightly doped substrate layer 10 of FIG. 1 is lost in structure FIG. 2. This elimination of an added barrier layer does however result in one less process step which may lead to a less costly fabrication.

Figure 3:
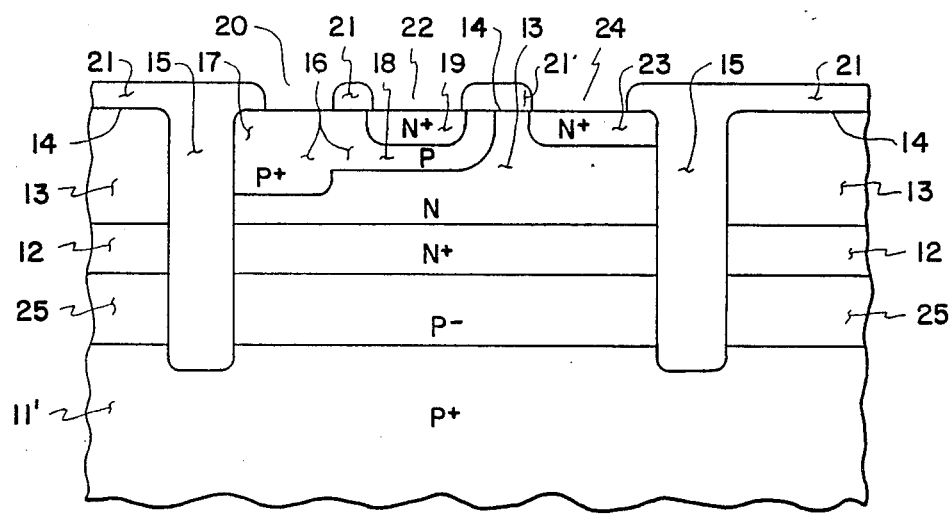
FIG. 3 shows a structural sketch of a further alternative embodiment of the present invention.

Yet another possibility is shown in FIG. 3 in which barrier layer 11' of FIG. 2 is in effect shifted away from buried layer 12 and layer 13 to permit interposing a lower conductivity layer, 25, therebetween as a lower capacitance buffer layer of the same conductivity type as substrate 11'. However, the lower conductivity of layer 25 is achieved by a lower concentration of boron atoms therein as a dopant, so that the concentration in layer 25 of $10^{15}$ atoms/cm$^3$ is designated p⁻. Again, all of the structures of FIG. 3 of the same purpose shown in FIG. 2 carry the designations in FIG. 3 that they had in FIG. 2. And again, buried layer 12 could be omitted.

In practice, buffer layer 25 would be provided by an epitaxial deposition on substrate 11' prior to the provision of buried layer 12 and epitaxial layer 13. The thickness of layer 25 after all processing to fabricate the device would be around 1 to 2 μm. This thickness is intended to be no greater than the width of the depletion layer expected to occur about the collector-buffer pn junction in operation. Thus, funnels emanating from the depletion layer will begin in p⁺ substrate 11' just as in the structures of FIGS. 1 and 2, and so be strongly limited in extent. The dopant concentration in, and the conductivity of, substrate 11' is again above that of active base region 18.

The advantages of reduced funnelling lengths in substrate 11' and the elimination of semiconductor material conductivity inversions and of parasitic npn transistors about the ends of isolating structure 15 are retained by the structure of FIG. 3. However, there will not be any significant increase in capacitance across the buffer-collector pn junction because the depletion layer formed in operation will be confined to layer 25 on the buffer-collector side of this junction and thus in relatively low conductivity material. As a result, the capacitance at this junction will not appreciably differ from that occurring at the collector-substrate junction of a conventional bipolar transistor so that voltage drops at the collector because of charge accumulating therein would be as it would for a similar amount of charge accumulating in a conventional transistor.

Nevertheless, there will be substantially less charge accumulating in the collector from a radiation particle impingement on the structure of FIG. 3 compared to a conventional transistor to thereby give a more charge disturbance resistant device because of the limited funnel lengths mentioned above. Although this resistance to charge disturbances isn't as significant as that in the structures of FIGS. 1 and 2, the structure of FIG. 3 offers an operating advantage because the capacitance of the collector-buffer junction is about the same as that of a conventional transistor collector-substrate capacitance. This advantage is that the structure of FIG. 3 can switch between being in the "off" or "on" condition as readily as a conventional transistor while still providing increased charge disturbance protection.

The embodiments of the invention in which an exclusive property or right is claimed are defined as follows:

1. A bipolar transistor comprising:
   a body of semiconductor material except in selected portions, said body having a first major surface;
   an isolating structure, comprising electrical insulating material, extending into said body from said major surface and forming both a closed path in said major surface and a wall in said body around an isolated region of said semiconductor material which isolated region intersects said first major surface;
   a substrate layer of said semiconductor material in said body which substrate layer is of a first conductivity type and of a first conductivity, said substrate layer being located farther in said body relative to said first major surface than said isolating structure extends, as aforesaid;
   a barrier layer of said semiconductor material in said body which barrier layer is of said first conductivity type and of a second conductivity greater than said first conductivity, said barrier layer located adjacent to said substrate layer with said isolating structure extending into said barrier layer but short of penetration therethrough so that a portion of said barrier layer is a part of said isolated region; and
   a collector region of said semiconductor material in said body of a second conductivity type except in a selected portion and located in said isolated region between said barrier layer and said first major surface but intersecting said first major surface, said selected portion which is excepted from said collector region including a base region of said first conductivity type except in selected regions including an emitter region, said emitter region being of said second conductivity type.

2. The apparatus of claim 1 wherein said barrier layer is of a thickness which is equal to or greater than that width taken by a depletion layer at least in part occurring therein if said bipolar transistor has voltage applied between said substrate layer and said collector region outside said base region of values at which said bipolar resistor is intended to operate.

3. The apparatus of claim 1 wherein there is further provided a buried layer of said semiconductor material in said body which buried layer is of said second conductivity type and of a third conductivity, said buried layer being located in said isolated region between said barrier layer and said collector region.

4. A bipolar transistor comprising:
a body of semiconductor material except in selected portions, said body having a first major surface;
an isolating structure, comprising electrical insulating material, extending into said body from said major surface and forming both a closed path in said major surface and a wall in said body around an isolated region of said semiconductor material which isolated region intersects said first major surface;
a substrate layer of said semiconductor material in said body which substrate layer is of a first conductivity type and of a first conductivity with said isolating structure extending into said substrate layer but short of penetrating therethrough so that a portion of said substrate layer is a part of said isolated region;
a buffer layer of said semiconductor material in said body which buffer is of said first conductivity type and of a second conductivity less than said first conductivity, said buffer layer located adjacent to said substrate layer so that said buffer layer is a part of said isolated region; and
a collector region of said semiconductor material in said body of a second conductivity type except in a selected portion and located in said isolated region between said buffer layer and said first major surface but intersecting said first major surface, said selected portion which is excepted from said collector region including a base region of said first conductivity type except in selected regions including an emitter region, said emitter region being of said second conductivity type.

5. The apparatus of claim 4 wherein said buffer layer is of a thickness which is equal to or less than that width taken by a depletion layer at least in part occurring therein if said bipolar transistor has voltage applied between said substrate layer and said collector region outside said base region of values at which said bipolar transistor is intended to operate.

6. The apparatus of claim 4 wherein there is further provided a buried layer of said semiconductor material in said body which buried layer is of a second conductivity type and of a third conductivity, said buried layer being located in said isolated region between said buffer layer and said collector region.

7. A bipolar transistor comprising:
a body of semiconductor material except in selected portions, said body having a first major surface;
an isolating structure, comprising electrical insulating material, extending into said body from said major surface and forming both a closed path in said major surface and a wall in said body around an isolated region of said semiconductor material which isolated region intersects said first major surface;
a substrate layer of said semiconductor material in said body which substrate layer is of a first conductivity type and therein at least includes a first strata which is of a first conductivity with said isolating structure extending into said first strata but short of penetrating therethrough so that a portion of said substrate layer is a part of said isolated region;
a collector region of said semiconductor material in said body of a second conductivity type except in a selected portion and located in said isolated region between said substrate layer and said first major surface but intersecting said first major surface, said selected portion which is excepted from said collector region including a base region of said first conductivity type except in selected regions including an emitter region, said base region being of a second conductivity that is less than said first conductivity in that portion thereof directly between said emitter region and said substrate layer, said emitter region being of said second conductivity type; and
a second strata included in said substrate layer opposite said first strata from said collector region which has a third conductivity less than said first conductivity.

8. The apparatus of claim 7 wherein said first strata is of a thickness which is equal to or greater than that width taken by a depletion layer at least in part occurring therein if said bipolar transistor has voltage applied between said substrate layer and said collector region outside said base region of values at which said bipolar transistor is intended to operate.

9. The apparatus of claim 7 wherein there is further provided a buried layer of said semiconductor material in said body which buried layer is of said second conductivity type and of a fourth conductivity, said buried layer being located in said isolated region between said first strata and said collector region.

10. A bipolar transistor comprising:
a body of semiconductor material except in selected portions, said body having a first major surface;
an isolating structure, comprising electrical insulating material, extending into said body from said major surface and forming both a closed path in said major surface and a wall in said body around an isolated region of said semiconductor material which isolated region intersects said first major surface;
a substrate layer of said semiconductor material in said body which substrate layer is of a first conductivity type and therein at least includes a first strata which is of a first conductivity with said isolating structure extending into said first strata but short of penetrating therethrough so that a portion of said substrate layer is a part of said isolated region;
a collector region of said semiconductor material in said body of a second conductivity type except in a selected portion and located in said isolated region between said substrate layer and said first major surface but intersecting said first major surface, said selected portion which is excepted from said collector region including a base region of said first conductivity type except in selected regions including an emitter region, said base region being of a second conductivity that is less than said first conductivity in that portion thereof directly between said emitter region and said substrate layer, said emitter region being of said second conductivity type; and a second strata in said substrate layer on that side of said first strata that said collector region is on which has a third conductivity less than said first conductivity and which is entirely in said isolated region.

11. The apparatus of claim 10 wherein said second strata is of a thickness which is equal to or less than that width taken by a depletion layer at least in part occurring therein if said bipolar transistor has voltage applied between said substrate layer and said collector region outside said base region of values at which said bipolar transistor is intended to operate.

12. The apparatus of claim 10 wherein there is further provided a buried layer of said semiconductor material in said body, which buried layer is of a second conductivity type and of a fourth conductivity, said buried layer being located in said isolated region between said second strata and said collector region.

13. The apparatus of claim 10 wherein there is further provided a buried layer of said semiconductor material in said body which buried layer is of said second conductivity type and of a third conductivity, said buried layer being located in said isolated region between said substrate layer and said function control layer.

* * * * *

UNITED STATES PATENT AND TRADEMARK OFFICE
CERTIFICATE OF CORRECTION

PATENT NO. : 4,937,648
DATED : June 26, 1990
INVENTOR(S) : JACK S. T. HUANG

It is certified that error appears in the above-identified patent and that said Letters Patent is hereby corrected as shown below:

Cover page, Item [73], insert -- Assignee: Honeywell Inc., Minneapolis, MN --

Column 12, Line 14, delete "function control layer" and in lieu thereof insert -- collector region --

Signed and Sealed this

Fifteenth Day of December, 1992

Attest:

DOUGLAS B. COMER

Attesting Officer

Acting Commissioner of Patents and Trademarks